(12) United States Patent
Ahrikencheikh et al.

(10) Patent No.: US 6,667,628 B2
(45) Date of Patent: Dec. 23, 2003

(54) METHOD AND APPARATUS FOR THE MANAGEMENT OF FORCES IN A WIRELESS FIXTURE

(75) Inventors: Cherif Ahrikencheikh, Loveland, CO (US); Julie L Stahmer, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 16 days.

(21) Appl. No.: 10/114,546

(22) Filed: Apr. 2, 2002

(65) Prior Publication Data

US 2003/0184329 A1 Oct. 2, 2003

(51) Int. Cl.[7] .............................................. G01R 31/02
(52) U.S. Cl. ........................................ 324/754; 324/761
(58) Field of Search ................................ 324/754, 755, 324/756, 761

(56) References Cited

U.S. PATENT DOCUMENTS

| | | | | |
|---|---|---|---|---|
| 5,175,493 A | * | 12/1992 | Langgard | .................... 324/761 |
| 5,227,718 A | * | 7/1993 | Stowers et al. | .............. 324/761 |
| 5,982,187 A | * | 11/1999 | Tarzwell | ..................... 324/756 |
| 6,025,729 A | * | 2/2000 | Van Loan et al. | ........... 324/754 |
| 6,046,597 A | * | 4/2000 | Barabi | ......................... 324/755 |
| 6,047,469 A | * | 4/2000 | Luna | ........................... 324/754 |
| 6,066,957 A | | 5/2000 | Van Loan et al. | |
| 6,208,158 B1 | * | 3/2001 | Schein et al. | ................ 324/761 |
| 6,326,799 B1 | * | 12/2001 | Schein | ........................ 324/754 |
| 6,512,389 B1 | * | 1/2003 | Kocher | ........................ 324/755 |

FOREIGN PATENT DOCUMENTS

GB        2183938 A        11/1986

* cited by examiner

*Primary Examiner*—Ernest Karlsen
*Assistant Examiner*—Jermele M. Hollington (57) ABSTRACT

The present invention is directed to a method and apparatus for balancing forces in a fixture and reducing forces in a probe plate (208) housed in the fixture. A plurality of double-ended probes (200) are positioned in the probe plate (208). A first bit (216), located at one of the double-ended probe (200) is in contact with a board under test (206). A second bit (218), which is oppositely disposed and located on the other end of the double-ended probe (200) is in contact with a wireless PCB (202). A spring (220) runs the length of the double-ended probe (200) and is in contact with the first bit (216) and the second bit (218).

3 Claims, 3 Drawing Sheets

METHOD AND APPARATUS FOR THE MANAGEMENT OF FORCES IN A WIRELESS FIXTURE

BACKGROUND OF THE INVENTION

1. Field of the Invention

This invention relates to testing systems. Specifically, the present invention relates to electronic testing systems.

2. Description of the Related Art

Modern electronic systems are implemented with a large variety of circuits and devices (e.g. transistors, logic gates, etc). The circuits and devices are often located in a very small area. In addition, the connections between devices are routed within a small area. With such a large density of devices and connections between devices located in a small area, an industry has developed around testing modern electronic systems. The electronic systems are often deployed in circuit boards such as Printed Circuit Boards (PCB). These PCB boards include a large population of devices and a large population of connections between the devices. As a result, a variety of electronic test systems have developed to test Printed Circuit Boards.

A conventional PCB includes devices and a number of connections between the devices. The connections between devices serve as conduits for carrying electrical current between devices. The conduits for carrying electrical current are often referred to as traces. These conduits are also used in testing the devices and ultimately testing the PCB. The conduits running between devices are typically made of a conducting material such as metal. In addition on both the topside and the underside of the PCB, pockets of the metal material called pads, are formed to provide a point of contact for testing.

A conventional electronic test system includes a fixture and tester electronics. The fixture holds a board under test (e.g. PCB). In addition, the fixture aligns the board under test and provides a mechanism for signals generated by the tester electronics to reach the board under test and then return to the tester electronics for analysis. The fixture is positioned on top of the tester electronics.

Electronic test systems perform test on PCB's by sending currents through traces on the board under test. The currents are sent from one point on the PCB to a second point on the PCB. Typically, a contact is made with a pad on the underside of the PCB at a first location and a contact is made with a pad on the underside of the PCB at a second location. Current is then generated from the first location through the traces to the second location. A voltage can then be measured at the second location to determine if the traces and the connection to the traces are working properly. Tester electronics generate and measure the current. The tester electronics typically includes software that controls and automates the process.

Conventional electronic test systems typically include a wired fixture or a wireless fixture. In conventional electronic test systems that include a wired fixture, a board under test (e.g. PCB) is placed on a support located at the top of a fixture. A plurality of probes run through the central area of the fixture. The probes are housed in a probe plate. The probe plate keeps the probes in a substantially vertical position, so that the probes can serve as an electrical pathway for test signals. The probes make contact with the board under test at one end and extend within close proximity to the tester electronics on the other end. Wires are then run from the tester electronics to the probes via pins inserted in the probe plate. As a result, an electrical pathway is established from the tester electronics, across the wires, to the probes and then to the board under test. Test signals are then generated by the tester electronics. The test signals run across the electrical pathway and back to the tester electronics along a similar path. The test signals are then analyzed by the tester electronics.

In a wired fixture, the wires provide an electrical pathway for trace currents. The currents run through wires and then through the probes, to the board under test. However, as the number of devices on PCB's has increased and the sizes of the PCB's have decreased, it has become difficult to place these wires in such a small area. For example, a PCB that is 16 inch by 24 inch may have 3000 to 4000 devices on the board. As a result, 3000 to 4000 wires may need to be connected from the tester electronics to the probes. This results in an incredible amount of congestion in a very small area. In addition if there is a malfunction, it is very difficult to identify a single dysfunctional wire within the 4000 wires. Therefore troubleshooting becomes a major issue.

As a result, a more modern fixture assembly evolved which attempts to eliminate the need for wires in a fixture. This more recent version of the fixture is often referred to as a wireless fixture. In the more recent version, a fixture houses probes, which are used to engage pads on the underside of a board under test. A fixture PCB or wireless PCB is positioned within the fixture and located on an oppositely disposed end of the probes. The wireless PCB includes a plurality of trace patterns for conducting electrical signals within the PCB between pads on both the topside and underside of the wireless PCB. Contact is made between the tester and the underside of the wireless PCB. As a result, an electrical pathway is established between the tester and the wireless PCB. The test signals are routed through the various trace patterns within the wireless PCB. Probes then make contact with the topside of the wireless PCB and an electrical pathway is established between the wireless PCB and the board under test. Ultimately, using the wireless PCB, an electrical pathway is established from the tester, through the wireless PCB, to the board under test.

In order for a conventional electronic test system to function properly, a good electrical pathway must be established between the tester electronics and the board under test. As a result, the contacts and pathway between the tester electronics, the wireless PCB, the probes and the board under test must be established and maintained. In a conventional electronic test system, force is applied to the board under test and the wireless PCB so that the probes can conduct electricity by remaining in contact with both boards. Once the board under test and the wireless PCB are in contact with the probes, the fixture is able to facilitate the transfer of test signals to the board under test. However if there is spacing between either board and the probes, the test signals may not be conducted or may be conducted and produce incorrect readings.

The contact is maintained between the fixture PCB's and the fixture probes by applying downward forces on the board under test and upward force on the wireless PCB. The board under test is often placed in a vacuum-sealed area and downward forces are applied by removing the air out of the vacuum-sealed area. When the air is removed from the vacuum-sealed area, the board under test experiences a downward force (e.g. vacuum force). In addition, spring-loaded tester contact points (e.g. pins), which engage the underside of the wireless PCB, create upward forces on the wireless PCB. The fixture probes maintain their contact as a result of the downward force from board under test and the upward force from the wireless PCB.

As a result of the foregoing configuration, a great deal of stress can build up in a fixture. As mentioned above, the wireless PCB is subject to forces pushing upward so that it maintains contact with the probes. In addition, there are also downward forces applied to the board under test when air is removed from the vacuum sealed chamber or in systems without vacuum sealing, forces appear when the board under test is pulled down into position for testing. The upward forces are transferred through the wireless PCB to the probes. In addition, the downward forces are transferred through the board under test to the probes. Therefore, the probes receive both upward and downward forces in the fixture. Since the probes are mounted in the probe plate, these forces are also transferred to the probe plate.

There may be non-uniformity or imbalance between the forces. Probes may not be uniformly distributed in the fixture. As a result, there may be a higher concentration of probes in one area than in another area. The non-uniform distribution of probes result in a non-uniform distribution of forces in the fixture and in the probe plate. In addition, the sum of the upward forces may not equal the sum of the downward forces. When the upward forces do not balance the downward forces the fixture and the probe plate may experience an imbalance in forces. When the fixture and the probe plate experience an imbalance of upward and downward forces or alternatively, if the upward force is distributed in a different manner from the downward force, the probe plate, the board under test and the wireless PCB may ultimately deflect, deform, and possibly fracture.

A deflection of the probe plate, the board under test or the wireless PCB may affect the electrical pathway. For example, a deflection of the probe plate, the wireless PCB or the board under test may produce stress in the probes. This may shift a probe away from its contact with a pad on the board under test or the wireless PCB. The stress may cause probe tips at the end of the probes, which contact the board under test and the wireless PCB to fracture. The body of the probe itself may fracture. Ultimately, the stress conditions in the probes may result in a failure of a probe and as a result incorrect test readings or analysis may result.

In addition, the probes are contained and trapped within the configuration of the fixture; therefore the probe ends only displace a limited amount. Commonly, a probe end presses against a spring placed in a housing that is fixed with respect to the probe plate. As a result, the downward forces on the probes are transferred to the probe plate. In a similar fashion, the upward forces on the probes are transferred to the probe plate. Therefore, the probe plate experiences upward and downward forces. The board under test receives downward forces from the air being removed from the vacuum chamber and upward forces from the probes. The wireless PCB receives upward forces from the spring-loaded pins and downward forces from the probes. Therefore, unbalanced forces appear in the probe plate and both PCBs, as a result, the probe plate and the PCB's may deflect and deform.

Deflection of the probe plate and the PCB's ultimately may result in failures in testing. In addition hairline stress fractures in the PCB's may cause incorrect readings. However, it would be hard to detect whether the incorrect reading were due to the probe plate deflection, a failure in a PCB, a device on the PCB, or a trace between devices on a PCB.

Double-ended are press-fitted into a probe plate. In addition, in some configurations such as floating probe configurations, the probes are allowed some freedom of movement in the vertical direction and the probes experience some pivotal motion around their center axis. The bits located in the probes, which make contact with the board under test and the wireless PCB, are located in a separate cavity and have limited spring resisted displacement. As a result, the forces resulting from a deflection of the board under test are borne by the bit in contact with the board under test and result in a downward force on the probe and the probe plate. In addition, the forces resulting from a deflection of the wireless PCB are borne by the bit in contact with the wireless PCB and result in an upward force on the probe and the probe plate. In addition, if these probes are allowed pivotal movement around their center axis, the probes may swing out of position and the bits may lose contact with pads when forces are applied.

Stresses in the probe plate resulting from forces transferred through the probes; result in deflections in the probe plate. Deflections in the probe plate may result in the misalignment of one or multiple probes with the pads in the boards. In addition, misalignments of the probes may result in structural failures in the probes. Both the misalignment of the probes and the structural failure of the probes may result in the incorrect reading of test signals. Lastly, failure of the probe plate, such as hairline fracture or deformation, impact the probes and as a result, it becomes very difficult to troubleshoot whether there is a problem with the probe plate, the contact of the probe to the board, a bad device on the board under test, or a bad trace on one of the PCBs.

During the operation of an electronic tester system the board under test is removed from the fixture after testing. When the board is removed from the fixture the downward forces applied by pulling the board down into place for testing or removing air from the vacuum chamber, is also removed. As a result a significant imbalance of forces occur in the fixture. The fixture may also be removed from the tester electronics. When the fixture is removed from the tester electronics, the upward forces presented by the tester interface pins are no longer applied to the fixture. As a result, once again, a significant imbalance of forces may occur in the fixture. As mentioned earlier, the imbalance of forces, now caused by changes to the fixture configuration, may result in board deflection, probe misalignment and general fixture failure.

Thus, there is a need in the art for an apparatus that minimizes forces in a fixture. There is a need in the art for an apparatus that more effectively balances forces in the fixture, but still provides an electrical pathway for testing. Lastly, there is a need in the art for an apparatus that reduces forces in a probe plate.

SUMMARY OF THE INVENTION

A wireless fixture is presented. Downward forces from a board under test and upward forces from a wireless PCB are balanced and reduced using doubled-ended probes, that are press fitted into a probe plate using one or more concentric rings. Press fitting the double-ended probes restricts horizontal and torque movement of the double-ended probes and concentrates downward forces from the board under test and upward forces from the wireless PCB in the vertical direction. The double ended-probes each include a first bit, which is in contact with the board under test and a second bit with is in contact with the wireless PCB. A spring is in contact with the first and second bits and runs the full length of each double-ended probe. Current is transferred from the wireless PCB, through the first bit, to the spring and its housing, to the second bit and then to the board under test. As upward forces are applied from the wireless PCB and downward forces are applied from the board under test, the two bits are displaced in the vertical direction and the spring is compressed proportionally. As a result, the forces applied by the probes to the board under test and the wireless PCB are balanced and bypass the probe plate.

In one embodiment of the present invention a fixture comprises a probe plate including a plurality of cylindrical openings for receiving double-ended probes. Each of the plurality of cylindrical openings forming a sidewall in the probe plate, the sidewall including at least one indentation. The double-ended probes each further comprise, a socket including at least one concentric ring for press fitting into the indentation. An inner housing is positioned within the socket. The inner housing includes a first end and an oppositely disposed second end. A first bit is located within the inner housing and positioned at the first end of the inner housing. A spring is within the inner housing. The spring is in contact with the first bit and runs axially along the inner housing from the first end to the oppositely disposed second end. A second bit is within the inner housing. The second bit is in contact with the spring. The second bit is positioned at the second end of the inner housing.

A method of managing forces in a fixture is presented. The fixture comprises a board under test subject to a downward force and a wireless printed circuit board. The method comprises the steps of positioning a double-ended probe between the board under test and the wireless printed circuit board. The double-ended probe further comprises a first bit in contact with the board under test, a spring in contact with the first bit and a second bit in contact with the spring on one end and the wireless printed circuit board on another end. The method further comprises balancing forces in the probe by moving the first bit downward in response to the downward force, compressing the spring in response to moving the first bit downward and transferring loading to the second bit in response to compressing the spring.

A second method of balancing forces in a fixture is presented. The fixture comprises a board under test and a wireless printed circuit board subject to an upward force. The method comprises the steps of positioning a double-ended probe between the board under test and the wireless printed circuit board. The double-ended probe further comprises a first bit in contact with the board under test, a spring in contact with the first bit and a second bit in contact with the spring on one end and the wireless printed circuit board on another end. The method further comprising the steps of balancing forces in the probe by moving the second bit upward in response to the upward force, compressing the spring in response to moving the second bit upward and transferring loading to the first bit in response to compressing the spring.

A third method of reducing probe forces in a probe plate is presented. The probe forces include a downward force on the probe plate generated by a board under test and an upward force on the probe plate generated by a wireless printed circuit board. The method comprises the steps of positioning double-ended probes between the board under test and the wireless printed circuit board. The double-ended probes each further comprising a first bit in contact with the board under test, a spring in contact with the first bit and a second bit in contact with the spring on one end and the wireless printed circuit board on another end. The method further comprising the steps of reducing the probe forces in the probe plate by moving the first bit downward in response to the downward force generated by the board under test, moving the second bit upward in response to the upward force generated by the wireless printed circuit board and compressing the spring in response to moving the first bit downward and in response to moving the second bit upward.

DESCRIPTION OF THE INVENTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
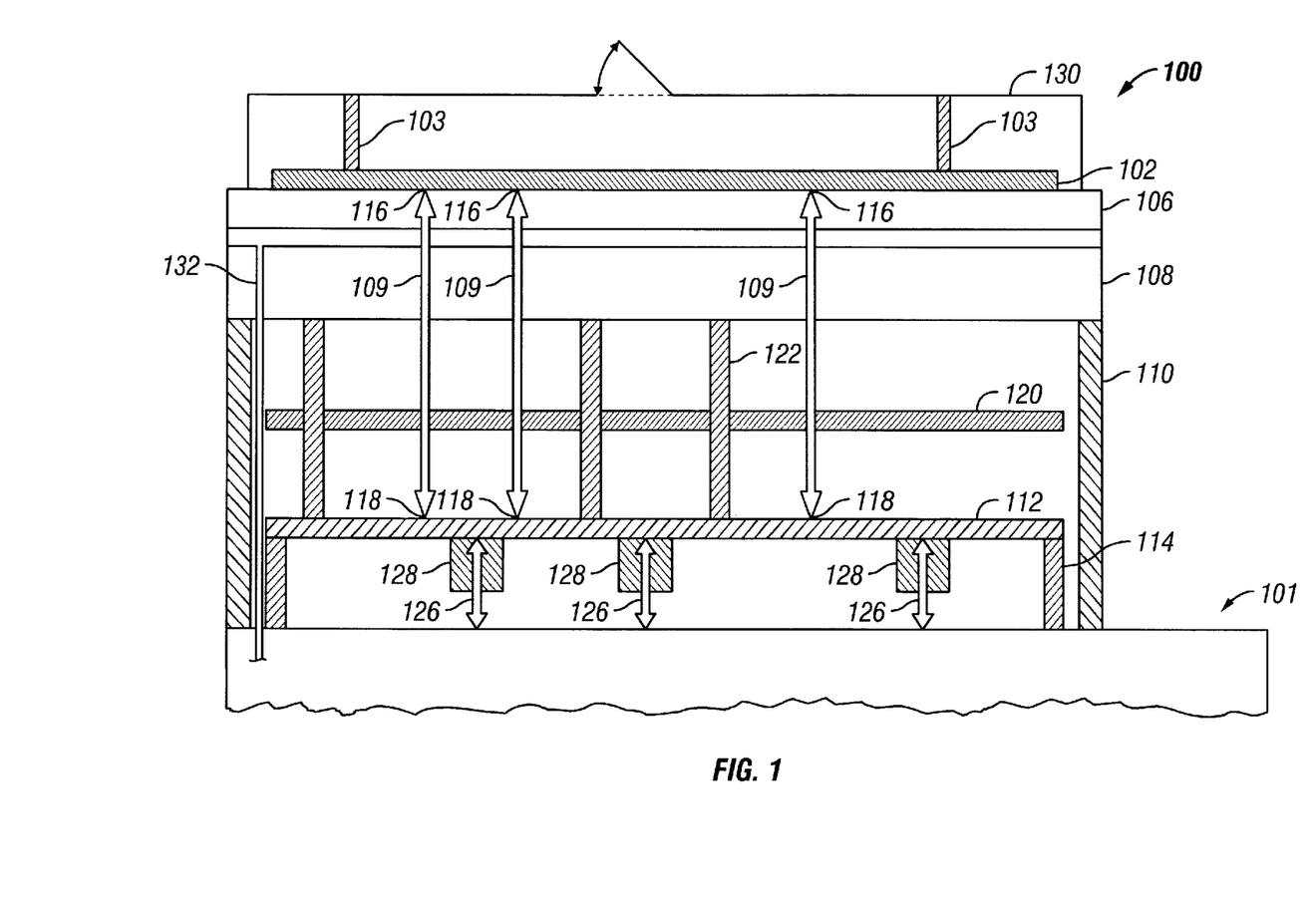
FIG. 1 is a system diagram of an electronic test system implemented in accordance with the teachings of the present invention.

FIG. 1 displays an electronic test system. In FIG. 1 a fixture 100 is shown. The fixture 100 is connected to tester electronics 101. The fixture 100 is used to position a board under test for testing. In addition, the fixture 100 maintains alignment of internal components and interfaces so that an electrical pathway can be established between a board under test and the tester electronics 101. The tester electronics 101 generates test patterns through the components and interfaces of the fixture 100. The tester electronics 101 also receives the test patterns through a feedback or return path in the fixture 100. As a result, the tester electronics 101 is capable of analyzing the test pattern and the board under test. In one embodiment of the present invention, the fixture 100 is a wireless fixture.

A board under test 102 is placed in the fixture 100. The board under test 102 may be a PCB board or another type of test specimen with integrated circuits. The board under test 102 used in the method and apparatus of the present invention may include devices such as resistors, capacitors, memories, digital components, integrated circuit chips, etc.

The board under test 102 includes specifications defining the amount of current and voltage that should appear at a specific location in the board under test. The designers and manufacturers typically detail these performance parameters. The tester electronics 101 performs tests by generating test patterns through the fixture 100 to the board under test. A return path is also established through the fixture 100 to receive the test pattern. The received test pattern is analyzed to determine if the board under test is performing according to the manufactures performance parameters.

The board under test 102 includes a number of conduits between devices (e.g. digital components and circuits). The conduits between devices are known as traces. The traces carry current from one device to another. In addition, the traces are often made of conducting material such as metal, for example gold is often used. Pads or leads are formed on both sides of the board under test. The pads provide a connection point for transferring test patterns between the tester electronics 101 and devices on the board under test 102.

The board under test 102 is supported by a support plate 106. The support plate 106 provides a stable platform for the board under test 102. In addition, in one embodiment of the present invention, spacers 103 are provided in the support plate 106 for pushing the board under test downward during testing operations. Below the support plate 106, a probe plate 108 holds a series of the double-ended probes 109 in position. The probe plate 108 is drilled with a pattern of holes known as a probe field. The probe field is designed to mate with the board under test 102. In the method and apparatus of the present invention, the double-ended probes 109 are press fitted into the holes in the probe plate 108.

The double-ended probes 109 make contact with pads on the underside of the board under test 102 as shown by 116 and communicate signals from the tester electronics 101 to the board under test 102. The probe plate 108 holds the double-ended probes 109 in a stable position, so that the double-ended probes 109 will have precise contact with the board under test 102 at the point shown by 116. The support plate 106 is supported by a fixture support structure 110.

A wireless PCB 112 is located on an oppositely disposed end of the double-ended probes 109. The wireless PCB 112 is filled with a multitude of trace patterns. As a result, the wireless PCB 112 serves as a conducting PCB and conducts current between the tester electronics 101 and the double-ended probes 109. The double ended-probes 109 transfer the current between the wireless PCB 112 and the board under test 102. As mentioned earlier, the wireless PCB 112 includes a number of traces running through the board. The traces provide current pathways from one location on the board to another location on the board. The topside of the wireless PCB 112 is specifically designed to mate with a specific board under test 102. As a result, the trace patterns running through the topside of the wireless PCB 112 are tailored to match the board under test 102. Both the underside and topside of the wireless PCB 112 include pads or leads. These pads serve as points of contact for conducting electricity through the wireless PCB 112. The wireless PCB 112 is supported on an inner fixture support 114 or fastened to the fixture frame with screws.

A number of spacers 122 are shown. The spacers 122 maintain equal spacing between the wireless PCB 112 and the probe plate 106. A guide plate 120 holds the spacers 122 in place. The guide plate 120 holds the spacers in position and enables an operator to remove and replace the spacers 120 in a coordinated manner. The guide plate also has holes for the probes, thus providing additional guidance for the probes to maintain their vertical position. The location of the spacers 122 and support points under the support plate 106 are determined using deflection analysis.

Spring-loaded interface pins 126 provide electrical conduction paths between the tester electronics 101 and the wireless PCB 112. The interface pins 126 provide an interface between the tester electronics 101 and the wireless PCB 112. In one embodiment, the Interface pins 126 are encased in support beams 128 as part of the fixture, in another embodiment they can be separated from the fixture and interfaced to the tester by other means. Since the interface pins 126 are spring-loaded, they apply upward force to the wireless PCB 112. For example, in a typical embodiment, the wireless PCB 112, may receive an upward force of 4 oz on each interface pin 126. In a typical electronic test system there may be 6800 or more interface pins. This would result in an upward force of in excess of 24,000 oz of pressure or 1500 lbs of pressure on the wireless PCB 112.

In one embodiment, a support beam 128 provides a stable support for the interface pins 126. The support beams 128, runs the length of the fixture 100 and provides continuous support throughout the fixture 100. A vacuum-sealed area 130 is shown. The vacuum-sealed area 130 houses the board under test 102 and the support plate 106. A vacuum suction hose 132 is used to remove air from the vacuum-sealed area 130. When suction is applied to the vacuum-sealed area 130, air is removed and the board under test 102 experiences a downward force.

As a result of the foregoing configuration, the board under test 102 receives a downward force from the suction of the air out of the vacuum-sealed area 130. The wireless PCB 112 receives an upward force from the spring-loaded interface pins 126. The double-ended probes 109 receive both upward and downward force. The downward force results from the interface of the double-ended probes 109 with the board under test 102. The upward force is transmitted through the spring-loaded interface pins 126 to the wireless PCB 112 and then ultimately to the double-ended probes 109.

Figure 2:
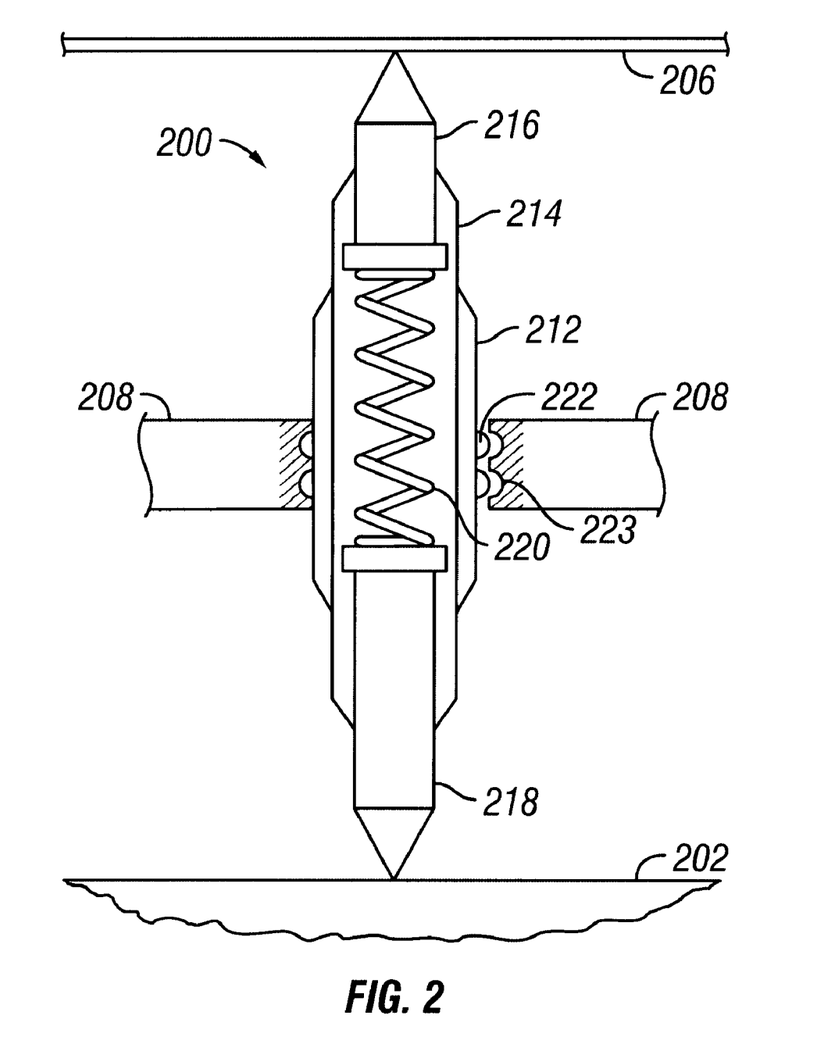
FIG. 2 is a schematic of a double-ended probe implemented in accordance with the teachings of the present invention.

FIG. 2 displays an embodiment of a double-ended probe 200 consistent with the teachings of the present invention. In FIG. 2 a wireless PCB 202 is shown. In addition, the board under test is shown as 206. The board under test 206 is moved downward vertically when air is removed from the vacuum-sealed chamber (e.g. 130 of FIG. 1). A probe plate 208 holds a double-ended probe 200 in place. A socket 212 houses an inner housing 214, which runs the length of the double-ended probe 200. The inner housing 214 houses a first bit 216 and a second bit 218. Both the first bit 216 and the second bit 218 are in contact with a spring 220. The spring 220 runs the entire length of the inner housing 214. A series of concentric rings 222 known as press rings, encircle the socket 212. In the present invention, there may be as many concentric rings 222 as necessary to stabilize the double-ended probe. The probe plate includes a pattern of cylindrically shaped openings for receiving the double-ended probes 200. The cylindrically shaped openings form a sidewall in the probe plate. The sidewall includes a number of indentations or detents 223 for receiving the concentric rings 222. The indentations 223, match the pattern of concentric rings 222. The concentric rings 222 are press fitted into the indentations 223 stabilizing the double-ended probe 200. As a result of the stabilization, the components of the double-ended probe 200 (e.g. the ends, the bits, etc) are restricted to freedom of motion in the vertical or axial direction and the inner casing 214 is held fixed in the probe plate.

The first bit 216 makes contact with the board under test 206. The second bit 218 makes contact with the wireless PCB 202. The first bit 216 and the second bit 218 are capable of moving in the vertical direction within the inner casing 214. The spring 220 is in contact with the first bit 216 on one end and in contact with the second bit 218 on an oppositely disposed end. Current conducted from the wireless PCB 202 is transferred across the second bit 218, through the spring 220 to the first bit 216 and ultimately to the board under test 206.

In one embodiment of the present invention, the double-ended probe 200 may be a probe of about 3 inches in length. Compliant double-ended probes are made of nickel, silver or gold plating. The spring which runs the length of the double-ended probe may be constructed from music wire or gold plated wire. The spring may include a spring force of up to 5 oz to force contact between the bits and the boards.

A number of conventional bits may be used in the method and apparatus of the present invention. Shapes such as the spear shaped bits, crown shaped bits, flat or serrated bits are all contemplated within the scope of the present invention. However, it should be appreciated that while several dimensions and materials have been mentioned with respect to the present invention, a number of alternative dimensions and materials may be used and still remain within the scope of the present invention.

As forces from the board under test 206 and the wireless PCB 202 are applied, the first bit 216 and the second bit 218 move in a vertical direction and compress the spring 220. The compression transfers the probe forces applied to the two boards and bypasses the probe plate 208. In addition the contact with the two boards is maintained. As a result, electrical signals (e.g. test pattern) may be communicated from the wireless PCB 202 through the second bit 218, through the spring 220, through the first bit 216 to the board under test 206. As a result, the probe plate receives only a fraction of the vacuum force transferred by the support plate 106.

The spring 220 is contiguous with both the first bit 216 and the second bit 218. The compression of the spring 220 relieves the probe plate from the forces applied in the vertical direction, however, the spring still applies enough vertical force in both directions to maintain contact with the boards and provides a current path from the wireless PCB 202 to the board under test 206.

The first bit 216 in the double-ended probe 200 alleviates probe forces on the board under test by moving downward. Since the spring 220 is in contact with the first bit 216 the spring 220 compresses. The second bit 218 in the double-ended probe 200 alleviates probe forces on the wireless PCB by moving upward in the vertical direction. Since the spring is in contact with the second bit 218, the spring 220 compresses. As a result, the compression of the spring 220 alleviates forces on the probe plate 208.

When multiple double-ended probes are placed in the wireless fixture, each placed in contact with a board under test 206 at one end and with a wireless PCB 202 at the other end, the present embodiment balances the forces in the probes across the entire board under test 206 and the entire wireless PCB 202, while reducing forces in the probe plate 208. As a result, the primary forces in the probe plate 208 are the forces transmitted by the support plate 106 and the spacers 122. Therefore, if there are locations in the boards that receive more forces and have more stress points, the bits in each double-ended probe 200 will be moved by an amount proportional to the amount of force at that specific location. As a result, the collection of double-ended probes 200 would perform a load balancing function of the board under test 206 relative to the wireless PCB 202. In addition, the collection of double-ended probes 200 would also perform load balancing of the downward forces from the board under test, as well as, load balancing of the upward forces from the wireless PCB. Lastly, the double-ended probes 200 consistent with the teachings of the present invention reduce the build up of forces in the probe plate 208 caused by the forces on the double-ended probes.

Positioning the spring 220 to move axially along the full length of the inner housing 214; and placing the spring 220 in contact with the first bit 216 at one end and the second bit 218 at an oppositely disposed end; balances the probe forces on the board under test 206, the wireless PCB 202 and reduces forces in the probe plate 208. Further the first bit 216 and the second bit 218 move in a vertical direction toward each other and compress the spring 220, allowing the spring to move axially through the entire inner housing 214 and maintain contact with both the first bit 216 and the second bit 218. The continuous contact of the first bit 216, the spring 220 and the second bit 218, allows the downward force from the board under test 206 to be balanced against the upward force from the wireless PCB 202. Therefore, in the apparatus of the present invention, the forces on the probes and the boards are balanced. In addition, the spring 220 enables the first bit 216 and the second bit 218 to maintain contact with the board under test 206 and the wireless PCB 218, while reducing the force on the probe plate.

The board under test 206 may be in a vacuum-sealed environment. When the air is sucked out of the vacuum-sealed environment downward forces are applied to the board under test. However, it should also be appreciated that uneven downward forces may be applied to the board under test 206 as a result of securing the board or other actions performed with respect to the board under test 206. When a downward force is applied from the board under test 206, the first bit 216 is displaced in the vertical direction and is moved or forced downward. As a result of the downward motion of the first bit 216, the spring 220 is compressed. Since the spring runs the entire length of the inner cavity 214 and is in contact with the second bit 218, the second bit 218 receives the force (e.g. load) transferred through the spring. Since the spring runs through the full length of the inner housing 214 the spring is able to alleviate the downward force from the probe plate while still applying force upward, so that the first bit 216 maintains contact with the board under test 206.

When an upward force is applied from the wireless PCB 202, the second bit 218 is displaced in the vertical direction and is moved or forced upward. As a result of the upward motion of the second bit 202, the spring 220 is compressed. Since the spring 220 runs the entire length of the inner cavity 214 and is in contact with the first bit 216, the first bit 216 receives force (e.g. load) transferred through the spring 220. Since the spring runs through the full length of the inner housing 214 the spring is able to alleviate the upward force from the probe plate while still applying downward force to the second bit 218 to maintain contact with the wireless PCB 202.

When both upward and downward forces are applied (e.g. the downward force from the board under test 206 and the upward force from the wireless PCB 202), the method and apparatus of the present invention alleviates probe forces in the probes plate and balances the probe forces applied to the PCBs. In this scenario, both the first bit 216 and the second bit 218 are displaced in the vertical direction. In response to the displacement of the first bit 216 and the second bit 218 the spring 220 is compressed. Since the spring 220 is in contact with both the first bit 216 and the second bit 218, the spring 220 compresses to the point where it transfers to the boards, equal upward and downward forces. As a result, the probe forces do not appear in the probe plate 208 and the forces in the probe plate are those transferred by the support plate 106 and the spacers 122.

The spring 220 performs several functions. The spring 220 provides enough upward and downward force against the first bit 216 and the second bit 218 that the bits maintain contact with the board under test 206 and the wireless PCB 202. Secondly, since the spring 220 runs the entire length of the inner housing 214, the spring 220 compresses to a point where it balances the forces between the board under test 206 and the wireless PCB 202. As a result, the upward and downward forces in the fixture are proportionally distributed, equalized and balanced. Lastly, the forces in the probes bypass the probe plate.

As downward forces are applied from the board under test (206) and upward forces are applied from the wireless PCB (202), the bits (216, 218) move downward and upward respectively and the spring (220) compresses, alleviating/reducing forces in the probe plate (208). In addition, since the spring (220) runs the length of the double-ended probe (200) and is in contact with both the first bit (216) and the second bit (218), the downward forces coming from the board under test (206) are balanced against the upward forces coming from the wireless PCB (202). The double-ended probe (200) is press fitted into indentations (223), in the probe plate (208), with several concentric circles (222) to restrict pivoting around an axis. Lastly, the probe Plate (208) includes a probe field designed to mate with the board under test (206). The double-ended probes (200) placed in the probe plate (208) are then in position to balance non-uniform forces coming from the board under test (206) or the wireless PCB (202).

In the method and apparatus of the present invention forces in a fixture are balanced, transferred and reduced when the fixture is (1) removed from the tester electronics and not being used; (2) positioned on the tester without vacuum forces and the board under test unengaged; and (3) used on the tester with vacuum forces applied and the board under test is engaged, such as during testing.

When the fixture is removed from the tester electronics and unused, using the method and apparatus of the present invention, forces in the probe plate, the board under test, the support plate and the wireless PCB are minimal. When the fixture is positioned on the tester electronics, the vacuum is not applied and the board under test is unengaged; the probe plate receives a minimal amount of force from the tester pins at points where the spacers are in contact with the probe plate. The board under test receives minimal force loading. The support plate receives minimal force loading. The wireless PCB receives minimal loading from the tester pins below the wireless PCB and on the topside of the wireless PCB at locations where the wireless PCB is in contact with spacer points.

Using the method and apparatus of the present invention, when the fixture is in use on the tester, the vacuum is applied and the board under test is engaged for testing; the probe plate receives minimal loading from below the probe plate at points where the spacer makes contact with the wireless PCB. The force from below is generated by spring-loaded pins in the tester. The probe plate also receives minimal loading on the topside of the probe plate. The loading would occur at points where the support plate makes contact with the probe plate. The loading would be a downward force created by removing air from the vacuum chamber. When the fixture is in use the board under test would experience downward force from the vacuum, minimal upward forces from the pins in the tester electronics and support from the support plate. When the fixture is in use the support plate would experience minimal downward forces from the vacuum forces and upward forces from the pins in the tester electronics at the points where the probe plate makes contact with the support plate. When the fixture is in use the wireless PCB receives upward forces from the pins located in the tester electronics, downward forces at spacer contact points and downward forces at the probe contact points.

Proportionally distributing, equalizing and balancing the forces in the PCBs becomes even more significant when multiple double-ended probes are used in the fixture. With the method and apparatus of the present invention, unequally applied upward and downward forces may be equalized and balanced across the PCBs. For example, the probe plate includes holes that form a probe field. The holes are used to hold the double-ended probes. The probe field matches the circuit pattern of the board under test. Every board under test requires a unique probe field. As a result, when different boards are used in the fixture, different probe plates with different probe fields are implemented to interface with the boards under test. Since different boards with different designs and patterns are used, forces may be disproportionately applied to the boards and the probes in the fixture. In other words, upward forces may be greater than the downward forces in some locations. In addition, a large concentration of probes in a specific area may create non-uniformity of the forces across the fixture.

With the method and apparatus of the present invention each double-ended probe is capable of individually balancing the forces applied to the probe. As a result, when unequal forces are applied to the system each double-ended probe is capable of balancing the forces for their specific area of the fixture. The upward forces are balanced relative to the downward forces in the probes. Therefore the method and apparatus of the present invention accommodates a non-uniform distribution of forces or an imbalance of forces.

Figure 3:
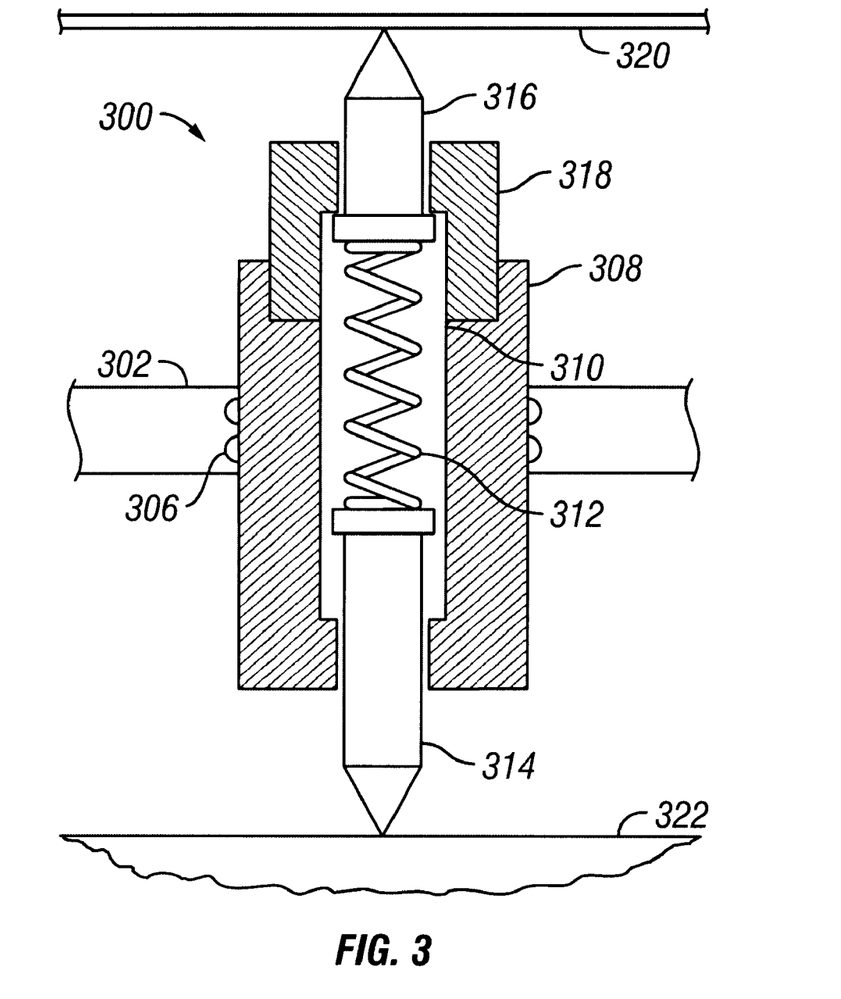
FIG. 3 is an alternate embodiment of the double-ended probe implemented in accordance with the teachings of the present invention.

FIG. 3 displays an alternate embodiment of a double-ended probe 300 consistent with the teachings of the present invention. In FIG. 3 a wireless PCB 322 is shown. In addition, the board under test 320 is shown. A probe plate 302 holds a double-ended probe 300 in place. A socket 308 forms an outer covering for the double-ended probe 300. An inner housing is shown as 310. The inner housing 310 houses a first bit 316, a second bit 314 and a spring 312. A removable cap 318 is fitted into the socket 308 and when aligned with the socket 308 completes the inner housing 310. The removable cap 318 may be screwed into the socket 308 or press fitted into the socket 308.

A spring 312 runs the entire length of the inner housing 310 and makes contact with the first bit 316 and the second bit 314. A series of concentric rings 306 encircle the socket 308. The series of concentric rings 306 are press fitted into the probe plate 302 stabilizing the double-ended probes 300. As a result of the stabilization, the double-ended probe 300 is restricted from torque movement or lateral motion at the ends, but instead is stabilized to allow freedom of movement in the vertical or axial direction.

The first bit 316 makes contact with the board under test 320. The second bit 314 makes contact with the wireless PCB 322. The first bit 316 and the second bit 314 are capable of moving in the vertical direction. The spring 312 is in contact with the first bit 316 and with the second bit 314. Electrical current communicated from the wireless PCB 322 is transmitted from the second bit 314, through the spring 312 to the first bit 316 and ultimately to the board under test 320.

The removable cap 318 provides a mechanism for removing the first bit 316, the second bit 314 and the spring 312. As a result, a broken bit or malfunctioning spring may be replaced without removing the double-ended probe 300. A repair may be performed by removing the removable cap 318 and replacing the first bit 316, the spring 312 or the second bit 314.

As forces from the board under test 320 and from the wireless PCB 322 are applied, the first bit 316 and the second bit 314 move in a vertical direction and compress the spring 312. The compression alleviates/reduces the forces in the probe plate and balances the forces applied to the two boards; however because of the upward and downward force of the spring, contact with the boards is maintained. As a result of the continuous contact, electrical current can be transferred from the wireless PCB 314 through the second bit 314, through the spring 312, through the first bit 316 to the board under test 320. Since the spring in the double-ended probe is in contact with both the first bit 316 and the second bit 314, a current path is established from the wireless PCB 322 to the board under test 320. The first bit 316 transfers the forces in the board under test 320 by moving downward in the vertical direction. The second bit in the double-ended probe 300 transfers the forces and stresses on the wireless PCB 322 by moving upward in the vertical direction. Compression of the spring 312 in both directions alleviates the build up of these forces in the probe plate 302.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

What is claimed is:

1. A fixture comprising:
    a probe plate including a plurality of cylindrical openings for receiving double-ended probes, each of the purality of cylindrical openings forming a sidewall in the probe plate, the sidewall including at least one indentation,
    the double-ended probes each further comprising,
        a socket including at least one concentric ring for press fitting into the at least one indentation,
        an inner housing positioned within the socket, the inner housing including a first end, an oppositely disposed second end wherein the second end comprises a removable cap,
        a first bit located within the inner housing and positioned at the first end of the inner housing,
        a spring within the inner housing, the spring in contact with the first bit and running axially along the inner housing from the first end to the oppositely disposed second end, and
        a second bit within the inner housing and in contact with the spring, the second bit positioned at the oppositely disposed second end of the inner housing.

2. A fixture as set forth in claim 1, wherein the removable cap may be screwed into the socket.

3. A fixture as set forth in claim 1, wherein the removable cap may be press fitted into the socket.

\* \* \* \* \*